United States Patent
Oda (12)

(10) Patent No.: US 6,316,833 B1
(45) Date of Patent: Nov. 13, 2001

(54) SEMICONDUCTOR DEVICE WITH MULTILAYER INTERCONNECTION HAVING HSQ FILM WITH IMPLANTED FLUORINE AND FLUORINE PREVENTING LINER

(75) Inventor: Noriaki Oda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/305,425

(22) Filed: May 5, 1999

(30) Foreign Application Priority Data

May 8, 1998 (JP) .................................... 10-126399

(51) Int. Cl.[7] .................................................. H01L 23/48
(52) U.S. Cl. ...................... 257/758; 257/623; 257/757; 257/760; 438/694; 438/780; 438/697
(58) Field of Search ........................... 257/623, 758–760; 438/694, 780, 697

(56) References Cited

U.S. PATENT DOCUMENTS

| | | | | |
|---|---|---|---|---|
| 5,757,079 | * | 5/1998 | McAllester et al. | 257/758 |
| 5,818,111 | * | 10/1998 | Jeng et al. | 257/776 |
| 5,899,751 | * | 5/1999 | Chang et al. | 438/623 |
| 5,939,789 | * | 8/1999 | Kawai et al. | 257/758 |
| 5,990,558 | * | 11/1999 | Tran | 257/759 |
| 6,008,540 | * | 12/1999 | Lu et al. | 257/758 |
| 6,054,769 | * | 4/2000 | Jeng | 257/759 |
| 6,114,186 | * | 9/2000 | Jeng et al. | 257/788 |

FOREIGN PATENT DOCUMENTS

| | | | |
|---|---|---|---|
| 4-73964 | 3/1992 | (JP) | H01L/27/108 |
| 07-240460 | 9/1995 | (JP) | H01L/21/768 |
| 8-064679 | 3/1996 | (JP) | H01L/21/763 |
| 8250490 | 9/1996 | (JP) | H01L/21/312 |
| 09-045769 | 2/1997 | (JP) | H01L/21/768 |
| 09-069562 | 3/1997 | (JP) | H01L/21/768 |
| 10-303295 | 11/1998 | (JP) | H01L/21/768 |

OTHER PUBLICATIONS

"Porous SOG for Intermetal Dielectrics" Aoi et al; Proceedings of the 52th Symposium on Semiconductor and Integrated Circuits Technology; pp. 62–67; Jun. 1997.

* cited by examiner

Primary Examiner—Fetsum Abraham
(74) Attorney, Agent, or Firm—Hayes, Soloway, Hennessey, Grossman & Hage, P.C.

(57) ABSTRACT

A semiconductor device with a multilevel interconnection has hydrogen silsesquioxane films which are made porous by etching action of hydrogen fluoride or by ion-implantation of impurities containing fluorine, as an interlayer insulating film for filling up a space between wires. Consequently, a dielectric constant of HSQ is low and wiring capacitance of the multilayer interconnection can be reduced.

9 Claims, 5 Drawing Sheets

SEMICONDUCTOR DEVICE WITH MULTILAYER INTERCONNECTION HAVING HSQ FILM WITH IMPLANTED FLUORINE AND FLUORINE PREVENTING LINER

BACKGROUND OF THE INVENTION

1. Field of the Invention

The present invention relates to a semiconductor device with multilevel interconnection structure and a manufacturing method thereof, and more particularly, it relates to a semiconductor device with a multilevel interconnection whose wiring capacitance is reduced and a manufacturing method thereof.

2. Description of the Related Arts

There is observed an effective wherein as the wiring pitch becomes smaller, and the distance between adjacent wires becomes shorter, the wiring capacitance increases as a semiconductor device becomes more minute. When the wiring capacitance increases, the operational speed of a circuit becomes slower, the electric power consumed becomes larger. Therefore, for reducing wiring capacitance, it is required to use a low dielectric constant film as an interlayer insulating film.

An inorganic SOG (Spin-on-glass) such as HSQ (hydrogen silsesquioxane) has a comparatively low dielectric constant of approximately 3.0, and further, it has a thermal resistance of approximately 400° C., and therefore, it is a very useful material. However, the dielectric constant of HSQ is still high when compared with that of an organic film, and it is desired to further lower this dielectric constant of HSQ. As a method to reduce the dielectric constant of an inorganic SOG film, for example, there is a method shown in "Study of Porous Interlayer Insulating Film Material" Aoi, et al. (Proceedings of the 52th symposium on Semiconductor and Integrated Circuits Technology, pp. 62–67 (1997), in which silylation is performed by adding a silylation agent to an SOG solution, coupled with, amine processing the resulting dielectric constant is lowered to approximately 2.3, the diameter of a pore is made fine, and humidity resistance is improved.

However, in the above conventional semiconductor device with multilayer structure, solution processing is troublesome, and there is also a problem in stability of wiring capacitance.

In Japanese Patent Laid-Open Publication No. 8-250490, a method is disclosed, where a thin film of a modified HSQ thin film precursor is coated on a semiconductor substrate with a conductor. This HSQ thin film precursor comprises a hydrogen silsesquioxane resin, and preferably a modifier selected from among the group consisting of alkylalkoxysilane, alkylalkoxysilane fluoride, and a combination thereof. However, the prior art described in this publication also has a weak point because solution processing is troublesome and the stability of wiring capacitance is low.

SUMMARY OF THE INVENTION

It is an object of the present invention to provide a semiconductor device with a multilevel interconnection in which the dielectric constant of HSQ is low and wiring capacitance can be reduced, and a manufacturing method thereof.

A semiconductor device with a multilevel interconnection according to the present invention comprises a hydrogen silsesquioxane film made porous by etching with hydrogen fluoride and used as an interlayer insulating film for filling the space between wires.

Another semiconductor device with a multilevel interconnection according to the present invention comprises hydrogen silsesquioxane film made porous by ion-implantation of impurities containing fluorine used as an interlayer insulating film for filling the space between wires.

In this semiconductor device with a multilevel interconnection, it is preferable to perform said ion-implantation of impurities containing fluorine under the condition of 10 to 30 keV and $1 \times 10^{14}$ to $3 \times 10^{15}$ cm$^{-2}$.

A manufacturing method of a semiconductor device with a multilevel interconnection according to the present invention comprises the steps of disposing a hydrogen silsesquioxane film so as to fill the space between wires, baking the hydrogen silsesquioxane film, and implanting impurities containing fluorine by ion-implantation.

In this manufacturing method of a semiconductor device with a multilevel interconnection, it is preferable to perform said ion-implantation of impurities containing fluorine under the condition of 10 to 30 keV and $1 \times 10^{14}$ to $3 \times 10^{15}$ cm$^{-2}$.

According to the present invention, the dielectric constant of an HSQ film is low, and wiring capacitance can remarkably be reduced. Furthermore, according to the present invention, HSQ is made porous by etching of hydrogen fluoride or ion-implantation of impurities containing fluorine, and therefore the processing is extremely easy.

BRIEF DESCRIPTION OF THE INVENTION

DESCRIPTION OF THE PREFERRED EMBODIMENTS

Figure 1:
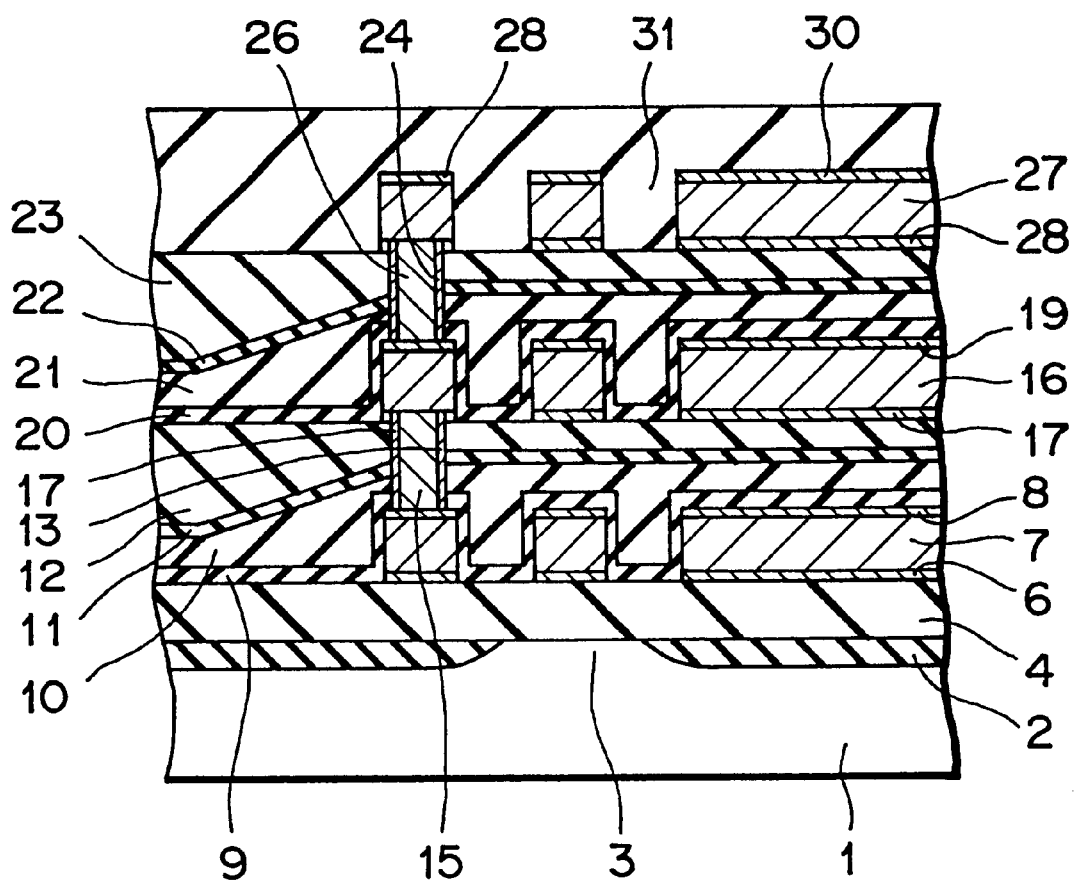
FIG. 1 is a cross sectional view showing a semiconductor device with a multilevel interconnection according to a first embodiment of the present invention.

Preferred embodiments of the present invention will concretely be described below by referring to accompanying drawings. FIG. 1 is a cross sectional view showing a semiconductor device according to an embodiment of the present invention. On the surface of a semiconductor substrate 1, element separating areas 2 are formed, and between these element separating areas 2, a diffusion layer area 3 is provided. Then, on the substrate 1, a first interlayer insulating film 4 is formed, and on this first interlayer insulating film 4, a first layer wiring 7 comprising aluminum is patterned through a barrier metal layer 6. On the first layer wiring 7, a high fusing point metal layer 8 is formed, and to cover the first layer wiring 7 and the high fusing point metal layer 8, a plasma oxide film 9 is formed. Then, to fill the space between these wires, a porous hydrogen silsesquioxane film (hereafter, referred to simply as an HSQ film) 10 is formed. This HSQ film 10 is made porous by etching action of hydrogen fluoride or by ion-implantation of impurities containing fluorine. Then, on this HSQ film 10, a plasma SiON layer 11 and a plasma oxide film 12 are formed, and the upper surface of the plasma oxide film 12 is made flat. Accordingly, under the porous HSQ film 10, a liner film (film thickness: approximately 50 nm) comprising the plasma oxide film 9 exists, and on the porous HSQ film 10, the plasma SiON layer 11 (film thickness: approximately 50 nm) exists, and on that, a plasma oxide film 12 exists.

A second layer wiring layer with the same structure is formed on the first layer wiring layer. That is, on a plasma oxide film 12, a high fusing point metal layer 17, a second layer wiring 16 comprising aluminum, a high fusing point metal layer 19, a plasma oxide film 20, a porous HSQ film 21, a plasma SiON layer 22, and a plasma oxide film 23 are formed, and the surface of this plasma oxide film 23 is made flat.

Moreover, on the second layer wiring layer, a third layer wiring layer is formed. That is, on a plasma oxide film 23, a high fusing point metal layer 28 is formed, and on this high fusing point metal layer 28, a third layer wiring 27 comprising aluminum is patterned. Then, on this third layer wiring 27, a high fusing point metal layer 30 is formed, and a cover film 31 is formed so as to cover each space between wires.

As mentioned above, the present embodiment has 3 layer wiring structure, and an interlayer insulating film between the second layer wiring 16 and the third layer wiring 27 also has the same structure as the interlayer insulating film between the first layer wiring 7 and the second layer wiring 16.

Then, the first layer wiring 7 and the second layer wiring 16 are connected by a via hole 13, and the peripheral surface of this via hole 13 is covered by the high fusing point metal layer 17, and further, the interior of the via hole 13 is filled up by a tungsten area 15, and this tungsten area 15 electrically connects the first layer wiring 7 and the second layer wiring 16. Similarly, the second layer wiring 16 and the third layer wiring 27 are connected by a via hole 24, the high fusing point metal layer 28, and the tungsten area 26.

In a semiconductor device composed like this, HSQ films 10, 21 as interlayer insulating films existing between the first layer wiring 7 and the second layer wiring 16 and between the second layer wiring 16 and the third layer wiring 27 are formed with porous HSQ, and therefore, the dielectric constant is extremely low, and the wiring capacitance can remarkably be reduced. Consequently, the acting speed of a circuit using a multilayer wiring becomes fast. On the other hand, since this porosity of HSQ is made by etching action of HF, the manufacturing process of a semiconductor is uncomplicated, and the stability of the manufacturing process is also high.

Figure 2:
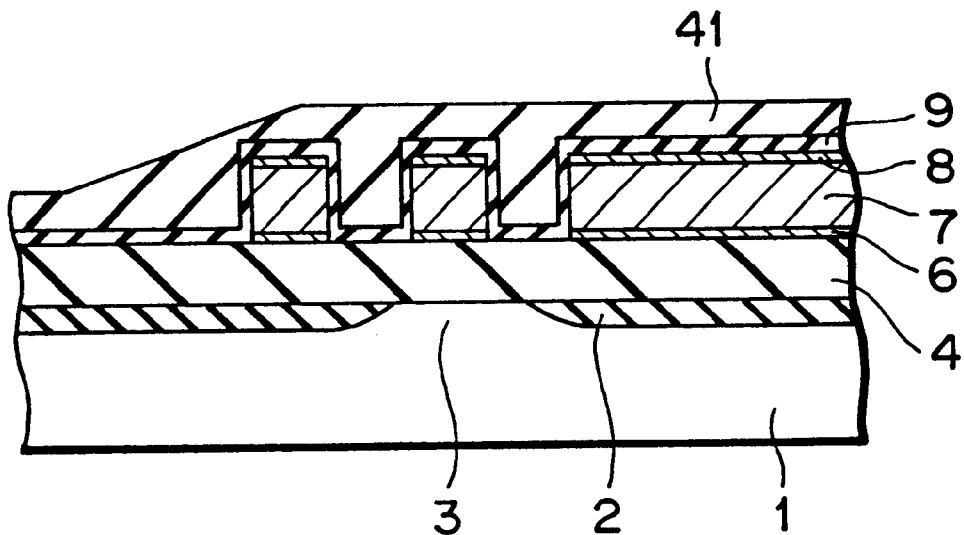
FIG. 2 is a cross sectional view showing 1 step of a manufacturing method.

Next, a manufacturing method of this semiconductor device with a multilevel interconnection will be described. FIG. 2 to FIG. 5 are cross sectional views showing the manufacturing method of a semiconductor device according to an embodiment of the present invention in the order of steps. First, as shown in FIG. 2, on a semiconductor substrate 1 where an element separating area 2 and a diffusion layer area 3 are formed, a first interlayer insulating film 4 is formed, and on that, a first layer wiring 5 is formed. The first layer wiring 5 comprises, for example, titanium (film thickness: 30 nm), a barrier metal layer 6 including titanium nitride (film thickness: 50 nm), aluminum, and a high fusing point metal layer 8 including titanium such as titanium nitride in this order from the bottom. A liner film (film thickness: approximately 50 nm) comprising a plasma oxide film 9 is formed, and an HSQ film 41 (film thickness: approximately: 0.4 microns at the flat portion) is coated, and baking (approximately 400° C.) is performed.

Figure 3:
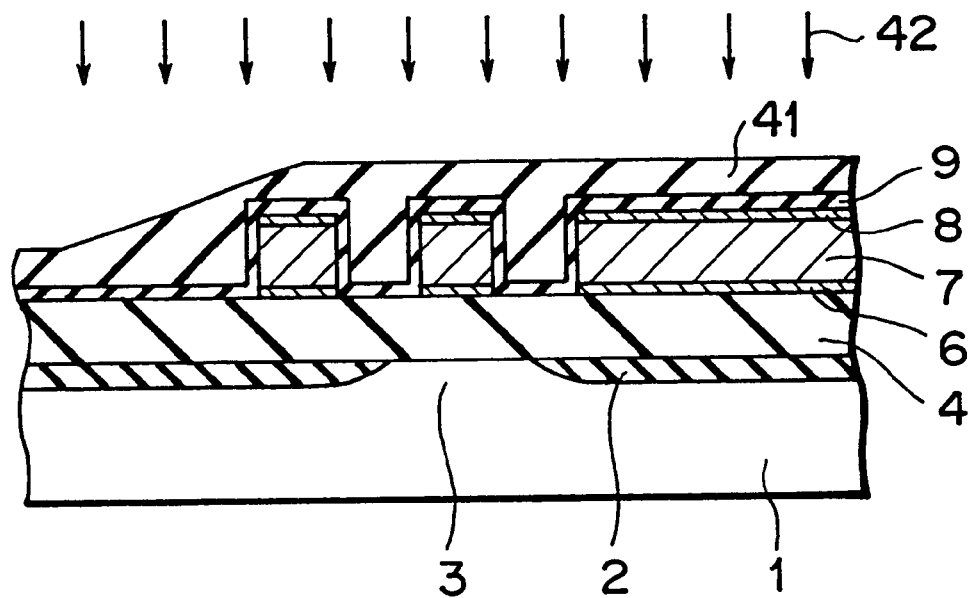
FIG. 3 is a cross sectional view showing the next step.

Next, as shown in FIG. 3, ion-implantation of fluorine 42 is performed (10 to 30 keV and $1 \times 10^{14}$ to $3 \times 10^{15}$ cm$^{-2}$). This ion-implantation is performed under the condition that the peak comes at a depth of approximately half of the film thickness of the HSQ film 41.

Figure 4:
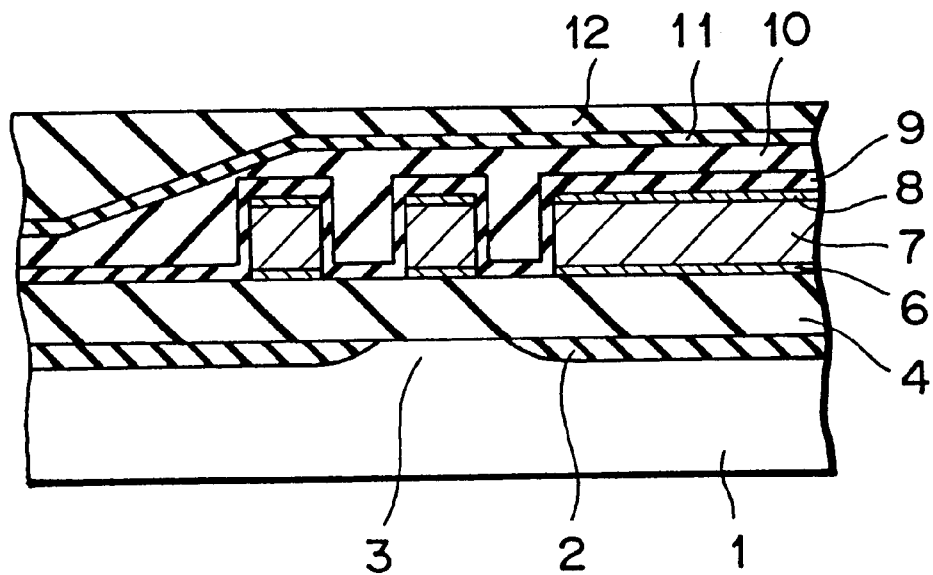
FIG. 4 is a cross sectional view showing the next step.

Next, as shown in FIG. 4, a plasma SiON 11 (film thickness: approximately 50 nm) is formed, and a plasma oxide film 12 is formed to have a film thickness of approximately 1.4 μm, and it is made flat by a chemical and mechanical polishing (CMP).

Figure 5:
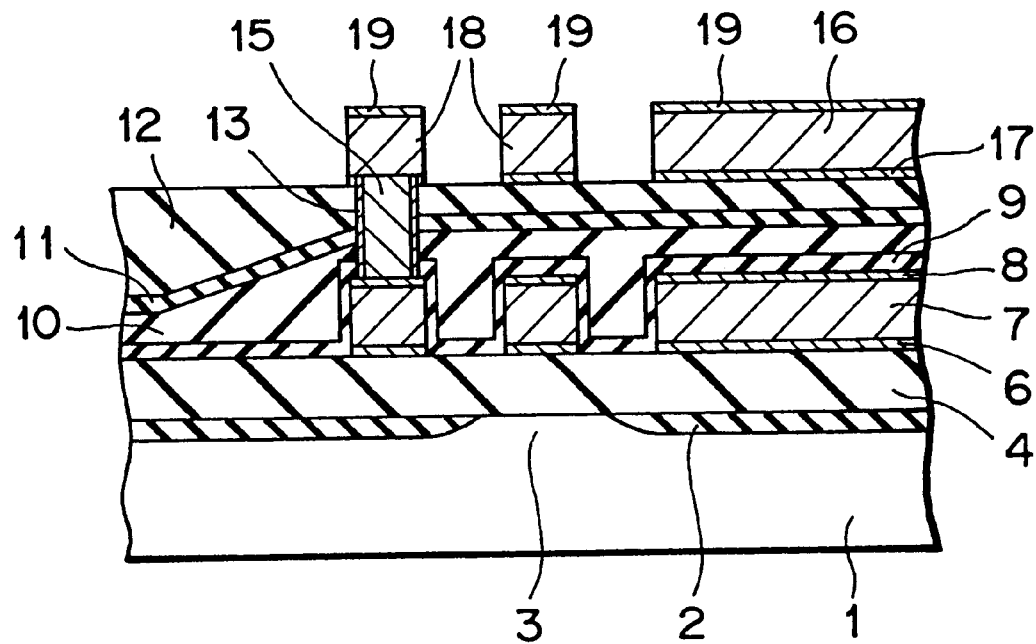
FIG. 5 is a cross sectional view showing the next step.

Next, as shown in FIG. 5, a via hole 13 is selectively opened, and the interior of a high fusing point metal 17 containing titanium such as titanium nitride (film thickness: approximately 500 Å) is filled up by a conductor (tungsten 15), and a second layer wiring 16 is formed. By repeating the same process, it is also possible to form wiring of more multiple layers.

In the present embodiment, by performing ion-implantation of fluorine to the HSQ film 10, Si—H connection in the HSQ film is broken, and fluorine and hydrogen are connected to be hydrogen fluoride (HF). When this is formed in the HSQ film, the HSQ film becomes porous, and the dielectric constant lowers. Then, since the HSQ film is buried in a space between adjacent wires in large amounts, the wiring capacitance is largely reduced.

By the way, it is also possible to make the HSQ film porous by etching action of hydrogen fluoride instead of ion-implantation of impurities containing fluorine.

Figure 6:
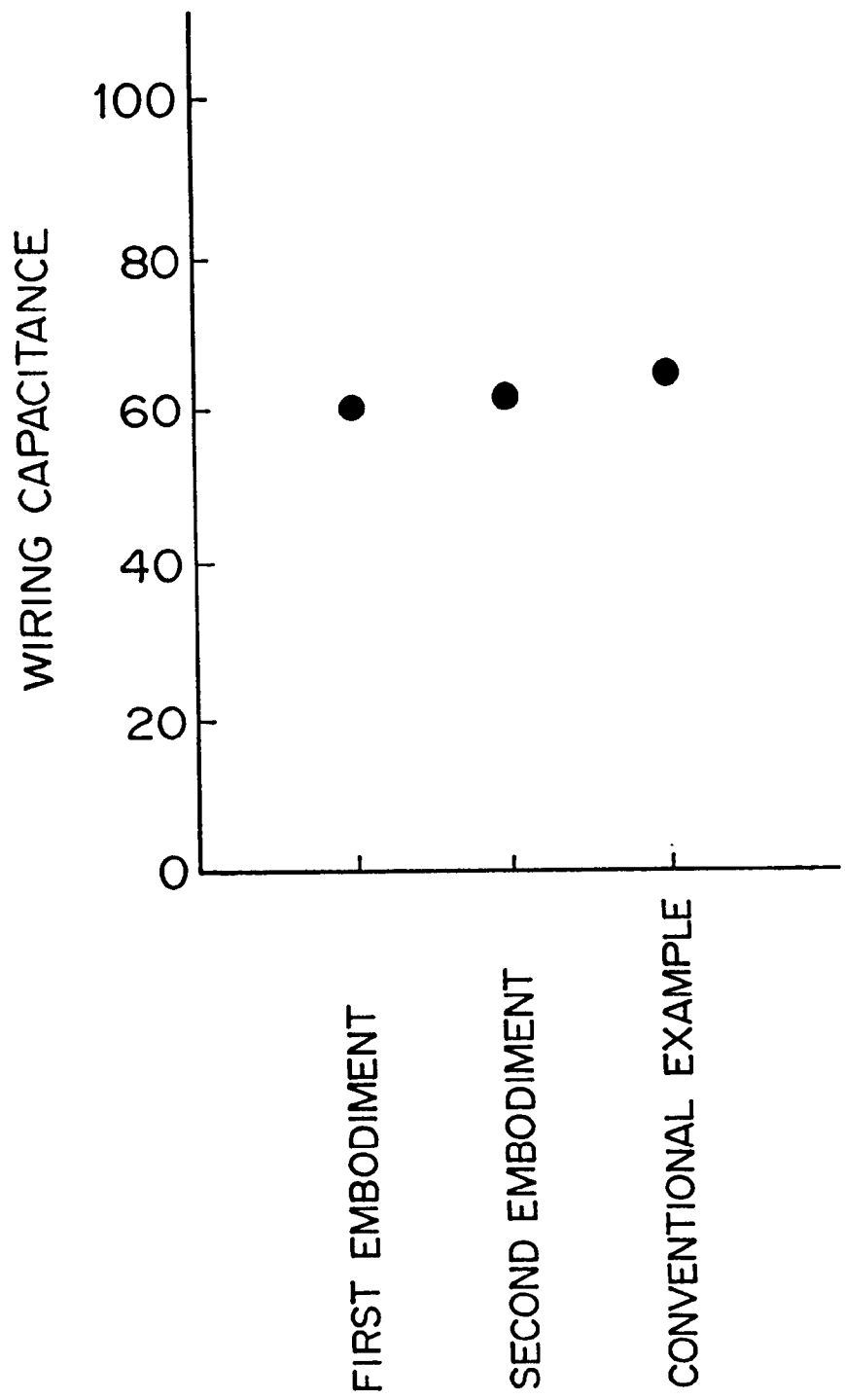
FIG. 6 is a figure showing an advantageous effect of the present invention.

FIG. 6 is a figure of a graph showing a difference in wiring capacitance between the present embodiment (first embodiment) and a conventional semiconductor device by comparing them, taking wiring capacitance in the vertical axis. A width and a space of wires are respectively 0.3 μm and 0.3 μm, and a film thickness of wires is approximately 0.6μm. In the first embodiment, reduction of capacity of approximately 5% is achieved when compared with the case of a conventional HSQ.

Figure 7:
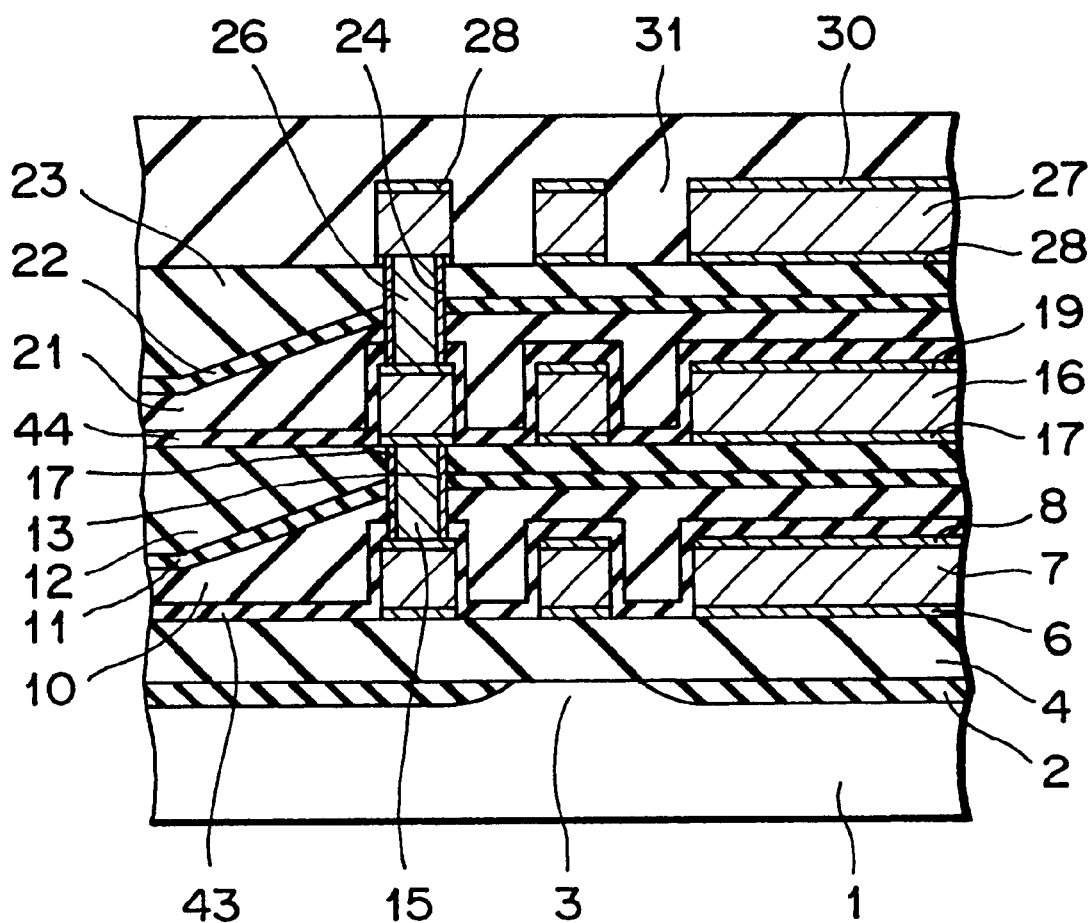
FIG. 7 is a cross sectional view showing a semiconductor device with a multilevel interconnection according to a second embodiment of the present invention.

Next, another embodiment of the present invention will be described by referring to FIG. 7. In FIG. 7, the same numerals are given to the components identical with those in FIG. 1, and the detailed description thereof will be omitted. The present embodiment is different from the first embodiment shown in FIG. 1 in that plasma SiON layers 43, 44 are formed instead of plasma oxide films 9, 20 of the first layer wiring layer and the second layer wiring layer of the first embodiment. In the present embodiment, an HSQ film 10 made porous by etching action of hydrogen fluoride also exists between wires of the first layer wiring 7 and on the first layer wiring 7. Under this porous HSQ film 10, there is a liner film (film thickness: approximately 50 nm) 43 comprising a plasma SiON layer. Furthermore, on the porous HSQ film 10, there is a plasma SiON layer (film thickness: approximately 50 nm) 11, and on that, there is a plasma oxide film 12. The upper surface of this plasma oxide film 12 is made flat. Furthermore, a plasma SiON layer 44 is also used for a liner film under the porous HSQ film 21 buried between wires of the second layer wiring 16.

In this embodiment, a plasma SiON layer 43 is used as a liner film under the porous HSQ film, and therefore, there is such an effect that it is possible to prevent HF generated in the HSQ film from diffusing in the wiring direction, and that it is possible to prevent corrosion of wiring.

Moreover, it is sufficient that impurities implanted into the HSQ layer by ion-implantation contain fluorine, and for example, $BF_2$ is also possible. In this case, it is necessary to perform implantation with accelerating energy larger than that of B ions.

In the present invention, the wiring capacitance is also remarkably reduced as shown in the second embodiment of FIG. 6.

What is claimed is:

1. A semiconductor device with multilevel interconnection comprising a porous hydrogen silsesquioxane film having a dielectric constant less than 3.0 as an interlayer insulating film for filling a space between wires, wherein said hydrogen silsesquioxane film is made porous by ion-implantation of impurities containing fluorine, and a fluorine-resistant liner film between said wire and said hydrogen silsesquioxane film.

2. The semiconductor device with a multilevel interconnection according to claim 1, wherein said hydrogen silsesquioxane film is made porous by ion-implantation of impurities containing fluorine performed under the conditions of 10 to 30 keV and $1 \times 10^{14}$ to $3 \times 10^{15}$ $cm^{-2}$.

3. A manufacturing method of a semiconductor device with a multilevel interconnection, comprising the steps of:
    forming a fluorine-resistant liner film on wires;
    forming a hydrogen silsesquioxane film on said fluorine-resistant liner film so as to fill up a space between wires;
    baking the hydrogen silsesquioxane film; and
    lowering the dielectric constant of said hydrogen silsesquioxane film to less than about 3.0 by performing ion-implantation of impurities containing fluorine.

4. The manufacturing method of a semiconductor device with a multilevel interconnection according to claim 3, wherein said ion-implantation of impurities containing fluorine is performed under the conditions of 10 to 30 keV and $1 \times 10^{14}$ to $3 \times 10^{15}$ $cm^{-2}$.

5. The manufacturing method of claim 3, wherein said ion-implantation of impurities containing fluorine is performed using an energy level of 10 to 30 keV and $1 \times 10^{14}$ to $3 \times 10^{15}$ $cm^{-2}$.

6. A semiconductor device, comprising:
    a first layer wiring;
    a first fluorine-resistant liner film on said first layer wiring;
    a second layer wiring; and
    a second fluorine-resistant liner film on said second layer wiring; and
    a first porous hydrogen silsesquioxane film having a dielectric constant less than 3.0 disposed between said first fluorine-resistant liner film and said second fluorine-resistant liner film, wherein said first hydrogen silsesquioxane film is made porous by ion-implantation of impurities containing fluorine.

7. The semiconductor device of claim 6, further comprising:
    a third layer wiring;
    a second porous hydrogen silsesquioxane film having a dielectric constant less than 3.0 disposed between said second layer wiring and said third layer wiring, wherein said second hydrogen silsesquioxane film is made porous by ion-implantation of impurities containing fluorine; and
    a third fluorine-resistant liner film between said third layer wiring and said hydrogen silsesquioxane film.

8. The semiconductor device of claim 6, wherein said ion-implantation of impurities containing fluorine is performed using an energy level of 10 to 30 keV and $1 \times 10^{14}$ to $3 \times 10^{15}$ $cm^{-2}$.

9. The semiconductor device of claim 7, wherein said ion-implantation of impurities in said second film is performed using an energy level of 10 to 30 keV and $1 \times 10^{14}$ to $3 \times 10^{15}$ $cm^{-2}$.

* * * * *